United States Patent

Senba et al.

[11] Patent Number: 5,973,392
[45] Date of Patent: Oct. 26, 1999

[54] STACKED CARRIER THREE-DIMENSIONAL MEMORY MODULE AND SEMICONDUCTOR DEVICE USING THE SAME

[75] Inventors: Naoji Senba; Yuzo Shimada; Ikusi Morizaki; Hideki Kusamitu; Makoto Ohtsuka; Katsumasa Hashimoto, all of Tokyo, Japan

[73] Assignee: NEC Corporation, Tokyo, Japan

[21] Appl. No.: 09/033,674

[22] Filed: Mar. 3, 1998

[30] Foreign Application Priority Data

Apr. 2, 1997 [JP] Japan .................................... 9-083182

[51] Int. Cl.$^6$ ........................... H01L 27/14; H01L 27/00; H01L 23/34; H05K 7/20
[52] U.S. Cl. ......................... 257/686; 257/685; 257/737; 257/738; 257/774; 257/723; 257/730
[58] Field of Search .................... 257/686, 685, 257/723, 730, 778, 777, 712, 713, 738, 737, 734, 690, 701, 774

[56] References Cited

U.S. PATENT DOCUMENTS

| | | | |
|---|---|---|---|
| 4,894,706 | 1/1990 | Sato et al. | 257/700 |
| 5,016,138 | 5/1991 | Woodman | 257/712 |
| 5,222,014 | 6/1993 | Lin | 257/701 |
| 5,247,423 | 9/1993 | Lin et al. | 361/719 |
| 5,600,541 | 2/1997 | Bone et al. | 257/686 |
| 5,633,783 | 5/1997 | Yamomoto | 257/686 |
| 5,715,144 | 2/1998 | Ameen et al. | 257/686 |
| 5,742,477 | 4/1998 | Babe | 257/713 |
| 5,760,478 | 6/1998 | Bozse et al. | 257/686 |
| 5,786,628 | 7/1998 | Beilstein et al. | 257/725 |
| 5,798,562 | 8/1998 | Kelley et al. | 257/723 |
| 5,801,438 | 9/1998 | Shirekawa et al. | 257/685 |
| 5,807,986 | 10/1998 | Davidson et al. | 174/262 |
| 5,811,879 | 9/1998 | Akram | 257/686 |
| 5,838,060 | 11/1998 | Comer | 257/723 |
| 5,838,551 | 11/1998 | Chon | 257/723 |

FOREIGN PATENT DOCUMENTS

| | | |
|---|---|---|
| 5-63138 | 3/1993 | Japan . |
| 5-121713 | 5/1993 | Japan . |
| 8-213541 | 8/1996 | Japan . |

*Primary Examiner*—Alexander Oscar Williams
*Attorney, Agent, or Firm*—Young & Thompson

[57] ABSTRACT

A three-dimensional memory module includes a plurality of semiconductor device units, every adjacent two of which are stack-connected via through-holes by a bump connecting method. Each of the plurality of semiconductor device units includes a carrier having a circuit pattern and the through-holes connected to the circuit pattern. The semiconductor device unit also includes at least one semiconductor memory chip mounted on the carrier such that the semiconductor memory chip is connected to the circuit pattern, and at least one chip select semiconductor chip mounted on the carrier to be connected to the circuit pattern such that the chip select semiconductor chip can select the semiconductor memory chip.

16 Claims, 8 Drawing Sheets

STACKED CARRIER THREE-DIMENSIONAL MEMORY MODULE AND SEMICONDUCTOR DEVICE USING THE SAME

BACKGROUND OF THE INVENTION

1. Field of the Invention

The present invention relates to a three-dimensional memory module and a semiconductor device which uses the same, and more particularly to a three-dimensional memory module which contains semiconductor memory chips and at least one chip selector chip and a semiconductor device which uses the same.

2. Description of the Related Art

A conventional three-dimensional integrated circuit device which contains a chip selector chip is described in Japanese Laid Open Patent Disclosure (JP-A-Heisei 5-121713). FIG. 1 shows the outline structure of the conventional three-dimensional integrated circuit device.

Referring to FIG. 1, the three-dimensional integrated circuit device has a lamination structure composed of a light sensor layer 41 as a first layer in which a plurality of amplification-type light elements are arranged in a matrix manner, an A/D converter layer as the second layer, and an arithmetic logic processing layer 43 as the third layer. The gate potential of each of the light elements in the light sensor layer 41 is kept at the hole accumulation potential which is accumulation potential due to holes accumulated as the result of the incidence of the light. Therefore, it is possible to read a signal without destroying a hole accumulation quantity, i.e., a data. By the addition of a selection circuit, the three-dimensional integrated circuit device of a full monolithic IC structure is accomplished. In the three-dimensional integrated circuit device, the amplification-type light elements are used to make random access possible such that a signal can be read from an arbitrarily designated one of the light elements arranged in the matrix array.

FIG. 2 shows a block diagram illustrating an example of the structure of the three-dimensional integrated circuit device shown in FIG. 1. Referring to FIG. 2, the three-dimensional integrated circuit device is composed of a light receiving section 20, a horizontal and vertical scanning circuits 21 and 22, a voltage generating circuit 23, a buffer circuit 32, an analog digital converter (ADC) 33, a buffer register 34, a CPU 35, a memory 36, an I/O buffer 37, a timing controller 38, an address decoder 39 and a shutter controller 40.

Because the operation of the circuit device shown in FIG. 2 is not related to the present invention, the detailed operation is omitted.

As described above, the conventional three-dimensional integrated circuit device with a chip selector chip incorporated employs a full monolithic IC structure. Therefore, in order to fabricate the three-dimensional integrated circuit device which has a desired memory capacity, it is necessary to start from the design of the monolithic IC.

Also, when the memory needs to have a capacity more than a memory which is commercially available at the present time, it is necessary to develop a new process for the monolithic IC.

However, the advanced technique, the long development period and the huge resource are needed for the development of a monolithic IC and the development of a new process technique for the monolithic IC.

SUMMARY OF THE INVENTION

The present invention is accomplished to solve the above problems. Therefore, an object of the present invention is to provide a three-dimensional memory module with a chip selector chip incorporated, which can be manufactured without the advanced technique and a long development period, and a semiconductor device using the three-dimensional memory module.

Another object of the present invention is to provide a semiconductor device using the above-mentioned three-dimensional memory module with the chip selector chip incorporated, which can be manufactured with low cost.

In order to achieve an aspect of the present invention, a three-dimensional memory module includes a plurality of semiconductor device units, every adjacent two of which are stack-connected via through-holes by a bump connecting method. Each of the plurality of semiconductor device units includes a carrier having a circuit pattern and the through-holes connected to the circuit pattern, at least one semiconductor memory chip mounted on the carrier such that the semiconductor memory chip is connected to the circuit pattern, and at least one chip select semiconductor chip mounted on the carrier to be connected to the circuit pattern such that the chip select semiconductor chip can select the semiconductor memory chip.

The carrier may have a cavity, and the chip select semiconductor chip may be mounted in the cavity of the carrier. In this case, the at least one semiconductor memory chip may be arranged to cover the chip select semiconductor chip via an insulative resin.

Also, when each of the semiconductor device units includes a plurality of semiconductor memory chips, the plurality of semiconductor memory chips are desirably arranged such that distances from the chip select semiconductor chip to the plurality of semiconductor memory chips are the shortest.

In order to achieve another aspect of the present invention, a three-dimensional memory module includes a plurality of semiconductor device units, every adjacent two of which are stack-connected via through-holes by a bump connecting method. Each of the plurality of semiconductor device units other than a specific one includes a carrier having a first circuit pattern and the through-holes connected to the first circuit pattern, and at least one semiconductor memory chip mounted on the carrier such that the semiconductor memory chip is connected to the first circuit pattern. The specific semiconductor device unit includes a carrier having a second circuit pattern and the through-holes connected to the second circuit pattern, and at least one chip select semiconductor chip mounted on the carrier to be connected to the second circuit pattern such that the chip select semiconductor chip can select the semiconductor memory chip of one of the plurality of semiconductor device units other than the specific semiconductor device unit.

In order to achieve still another aspect of the present invention, a semiconductor device, includes a circuit board having a first circuit pattern, and a plurality of three-dimensional memory modules mounted on the circuit board and connected to the first circuit pattern. Each of the plurality of three-dimensional memory module includes a plurality of semiconductor device units, every adjacent two of which are stack-connected via through-holes by a bump connecting method. Each of the plurality of semiconductor device units includes a carrier having a second circuit pattern and the through-holes connected to the circuit pattern, at least one semiconductor memory chip mounted on the carrier such that the semiconductor memory chip is connected to the second circuit pattern, and at least one chip select semiconductor chip mounted on the carrier to be connected to the second circuit pattern such that the chip select semiconductor chip can select the semiconductor memory chip.

In order to achieve yet still another aspect of the present invention, a semiconductor device includes a circuit board having a first circuit pattern, and a plurality of three-dimensional memory module mounted on the circuit board and connected to the first circuit pattern. Each of the plurality of three-dimensional memory module includes a plurality of semiconductor device units, every adjacent two of which are stack-connected via through-holes by a bump connecting method. Each of the plurality of semiconductor device units other than a specific one includes a carrier having a second circuit pattern and the through-holes connected to the second circuit pattern, and at least one semiconductor memory chip mounted on the carrier such that the semiconductor memory chip is connected to the second circuit pattern. The specific semiconductor device unit includes a carrier having a third circuit pattern and the through-holes connected to the third circuit pattern, and at least one chip select semiconductor chip mounted on the carrier to be connected to the third circuit pattern such that the chip select semiconductor chip can select the semiconductor memory chip of one of the plurality of semiconductor device units other than the specific semiconductor device unit.

DESCRIPTION OF THE PREFERRED EMBODIMENTS

A three-dimensional memory module with a chip selector chip incorporated of the present invention will be described in detail with reference to the attachment drawings.

Figure 1:
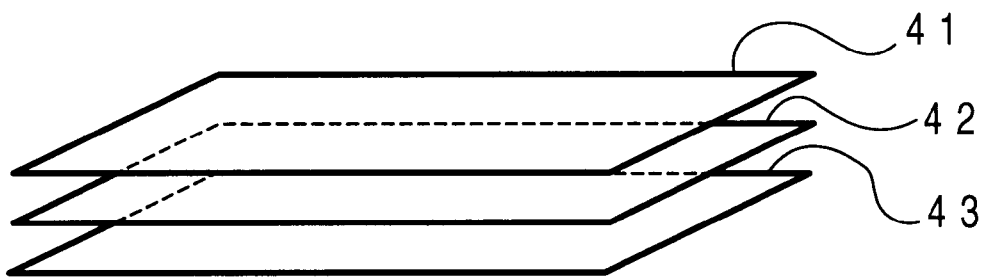
FIG. 1 is a diagram illustrating the structure of a conventional example of a three-dimensional integrated circuit device with a chip selector chip incorporated.
Figure 2:
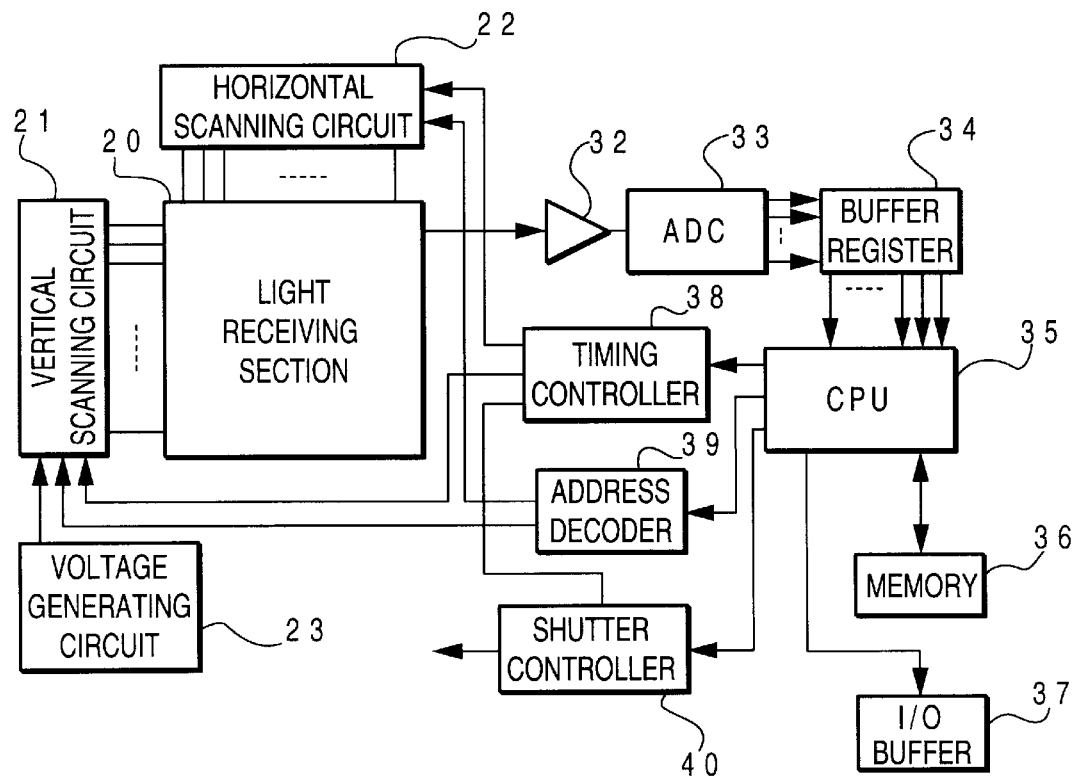
FIG. 2 is a block diagram illustrating the circuit block of the conventional example of the three-dimensional integrated circuit device with the chip selector chip incorporated.
Figure 3A:
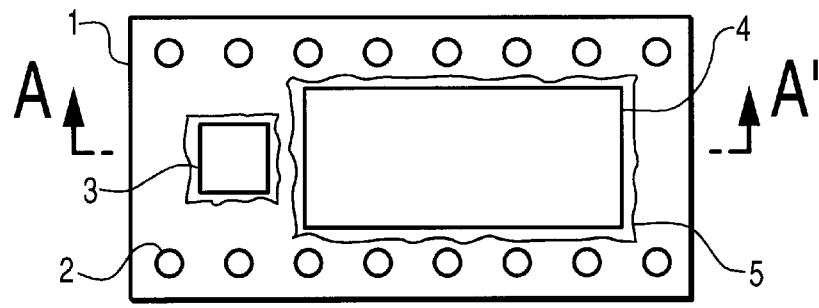
FIGS. 3A and 3B are a plan view and cross section view of the structure of a memory unit with a chip selector chip incorporated, according to a first embodiment of the present invention.
Figure 3B:
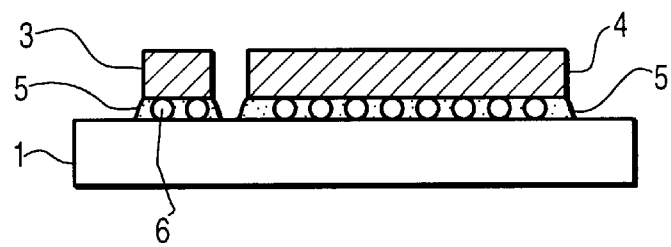
Figure 3C:
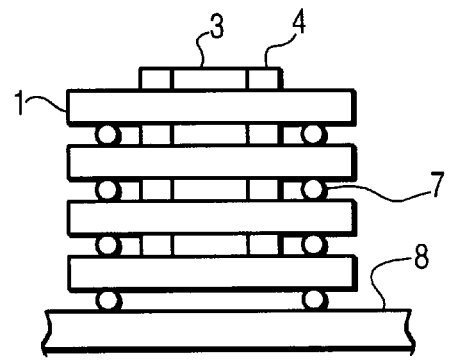
FIG. 3C is a side view of a three-dimensional memory module in which the three-dimensional memory units shown in FIGS. 3A and 3B are stacked.
Figure 3D:
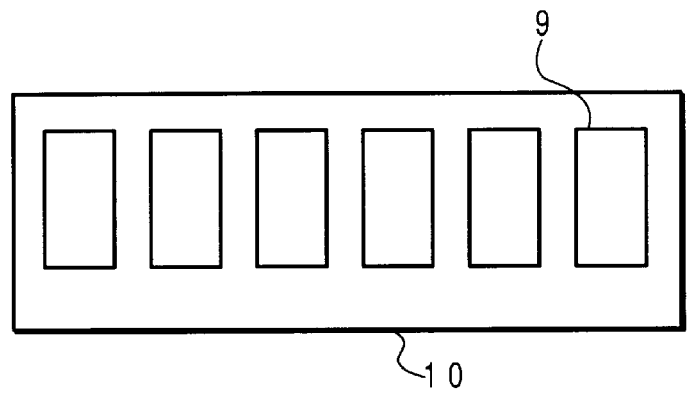
FIG. 3D is a plan view of a semiconductor device having an SIMM (single in line memory module) structure in which the semiconductor devices shown in FIG. 3C are arranged in line.

First, the three-dimensional memory module according to the first embodiment of the present invention will be described. FIGS. 3A and 3B are a plan view and cross sectional view of the structure of a three-dimensional memory unit with a chip selector chip incorporated according to the first embodiment of the present invention. FIG. 3C is a side view of a three-dimensional memory module in which the three-dimensional memory modules shown in FIGS. 3A and 3B are stacked up. FIG. 3D is a plan view of a semiconductor device having an SIMM (single in line memory module) structure in which the three-dimensional memory modules shown in FIG. 3C are arranged in line.

Referring to FIGS. 3A and 3B, a carrier 1 has a circuit pattern 16 and stack pads 2. A chip selector chip 3 and a memory chip 4 are mounted on a carrier 1 and are connected to the circuit pattern of the carrier 1 using solder bumps 6. The carrier 1 has a plurality of stack pads 2, as described above. Some or all of the plurality of stack pads are connected via through holes 15 to pads which are provided on a back surface of the carrier 1. Also, the solder bumps 6 are sealed with resin 5 to manufacture a single memory unit.

Next, as shown in FIG. 3C, a plurality of single memory units which are manufactured as above are stacked on a mother board 8 using the stack pads 2 and solder bumps 7 to form a multi-layer semiconductor device, i.e., a three-dimensional memory module in this example.

The carrier may include a cavity 13 in which the chip selector chip is mounted.

In the first embodiment, a single memory chip and a single chip selector chip are mounted on a single carrier 1. In case of this structure, the applicability of the memory unit shown in FIGS. 3A and 3B becomes very high.

FIG. 3D shows the structure in which the three-dimensional memory modules shown in FIG. 3C are arranged on a circuit board 10 in a line manner to form an SIMM (Single in line Memory Module) with circuit pattern 17. In this example, 4 three-dimensional memory units each having chip selector chips are stacked.

It should be noted that although the three-dimensional memory modules are mounted on the one side of the circuit board, the three-dimensional memory modules may be mounted of the both sides of the circuit board.

Figure 4A:
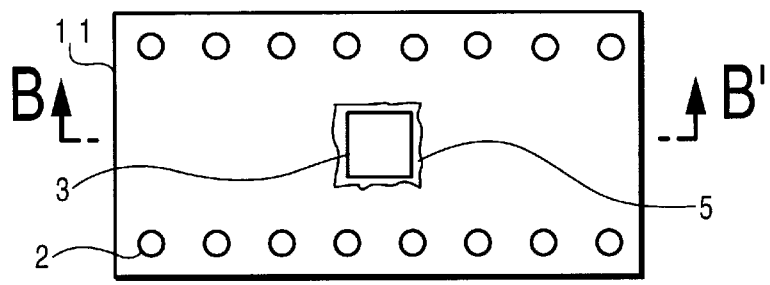
FIGS. 4A and 4B are a plan view and cross sectional view of the structure of a chip selector unit used in the three-dimensional memory module according to a second embodiment of the present invention, respectively.
Figure 4B:
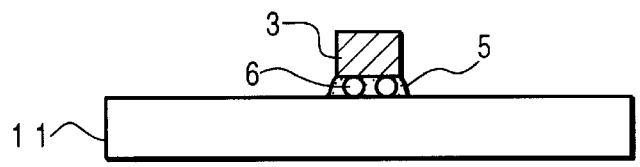

FIGS. 4A and 4B are a plan view and cross sectional view of a chip selector unit which is used the three-dimensional memory module according to the second embodiment of the present invention. The chip selector chip 3 is mounted on a carrier 11 such that the chip selector chip 3 is connected to a circuit pattern 16 of the carrier 11 by bumps 6. The carrier 11 has stack pads 2 connected to the circuit pattern 16, as in the first embodiment. The stack pads 2 are used for stacking memory units in each of which a memory chip is mounted on a carrier as described in the first embodiment. Also, the bumps 6 are sealed with a resin having an insulative property and an anti-moisture property. Thus, a chip selector unit is formed and used for the three-dimensional memory module.

Figure 4C:
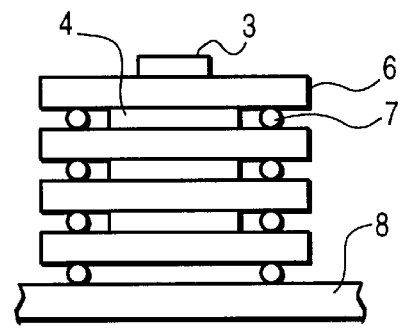
FIG. 4C is a side view of the three-dimensional memory module in which the chip selector unit is used shown in FIGS. 4A and 4B is used.

FIG. 4C is the left side view when 3 memory units, in each of which a memory chip 4 is incorporated, and 1 chip selector unit in which the chip selector chip 3 is incorporated, are stacked on a mother board 8 by use of the stack pads and bumps 7 to form a three-dimensional memory module. In this case, the single chip selector chip 3 is provided for every stack structure. In this structure, the efficiency becomes very high.

Figure 4D:
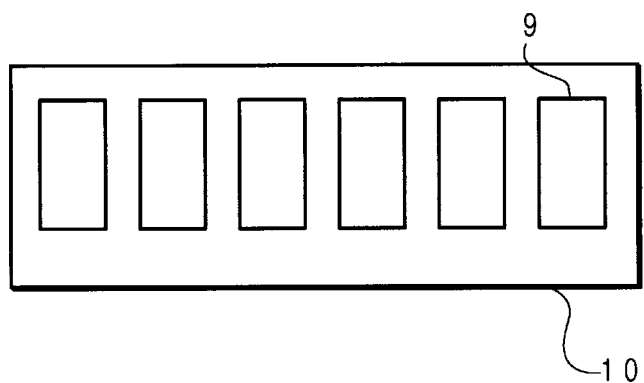
FIG. 4D is a plan view of a semiconductor device having an SIMM structure in which the three-dimensional memory modules shown in FIG. 4C are arranged in line.

FIG. 4D shows the structure in which the three-dimensional memory modules shown in FIG. 4C are arranged on the circuit board 10 in a line manner to form an SIMM module.

It should be noted that although the three-dimensional memory modules are mounted on the one side of the circuit board, the three-dimensional memory modules may be mounted of the both sides of the circuit board.

Figure 5A:
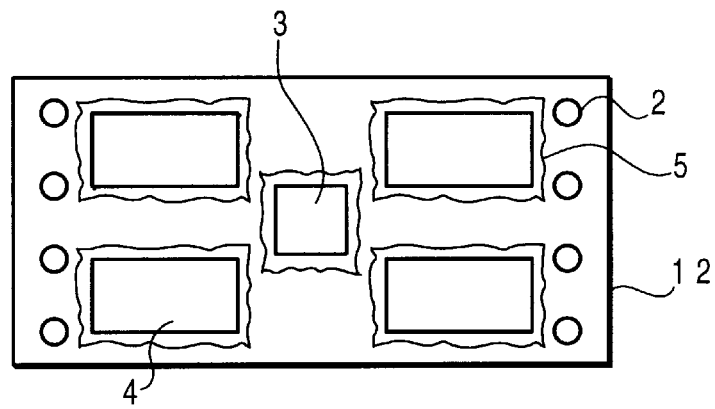
FIG. 5A is a plan view of the structure of a three-dimensional memory unit with a chip selector chip incorporated according to a third embodiment of the present invention.

FIG. 5A is a plan view of a memory unit according to the third embodiment of the present invention. In the memory unit in the third embodiment, a single chip selector chip 3 and 4 memory chips 4 are mounted on a multi-chip type carrier 12 by use of bumps. The bumps are sealed with resin 5. Thus, a memory unit is formed. The stack pads 2 connected to a circuit pattern 16 on the carrier 12 are used for stacking the memory units.

Figure 5B:
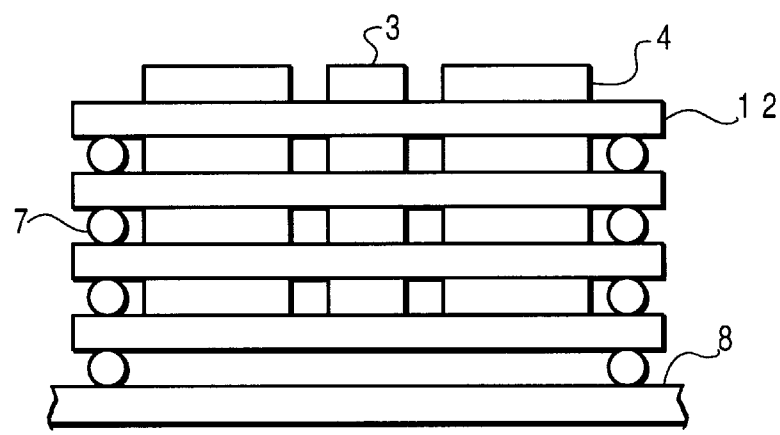
FIG. 5B is a cross sectional view of the structure of a three-dimensional memory module in which the three-dimensional memory units according to the third embodiment of the present invention shown in FIG. 5A are stacked.

FIG. 5B is a side view of a three-dimensional memory module when 4 memory units are stacked on the mother board 8 by use of the stack pads and bumps 7.

In this example, 4 memory chips and 1 chip selector chip is mounted on the multi-chip type carrier 12. In this structure, the generality becomes very high and also the memory capacity can be very much increased.

Figure 6:
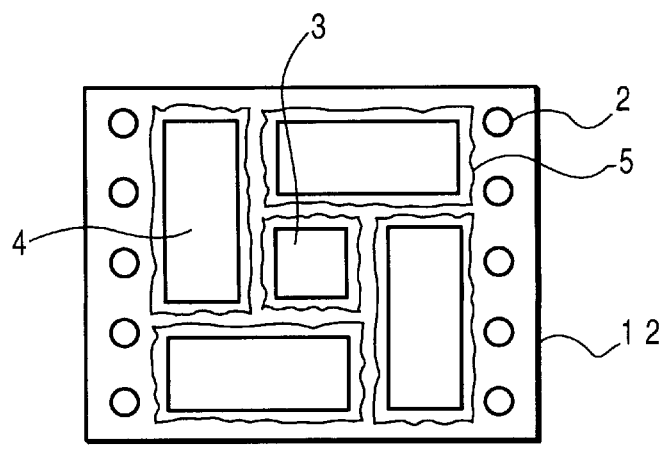
FIG. 6 is a plan view of the structure of the three-dimensional memory unit with a chip selector chip incorporated according to a fourth embodiment of the present invention.

FIG. 6 is the plan view illustrating the plan structure of a three-dimensional memory unit according to the fourth embodiment of the present invention. In FIG. 6, the optimal arrangement example of the memory chips 4 and the chip selector chip 3 on the multi-chip type carrier 12 is shown. In this example, the wiring lengths from the chip selector chip 3 to the memory chips 4 become the shortest. Thus, the high-speed operation of the three-dimensional memory module can be accomplished.

Figure 7A:
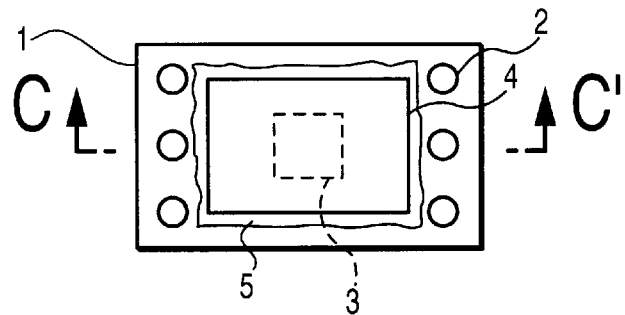
FIGS. 7A and 7B are a plan view and cross sectional view of the structure of a three-dimensional memory unit with a chip selector chip incorporated according to a fifth embodiment of the present invention.
Figure 7B:
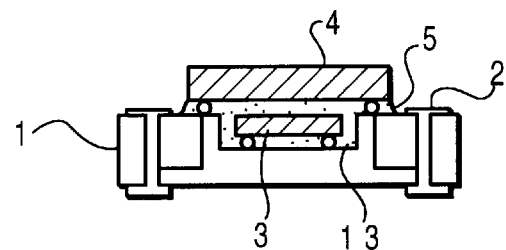

FIG. 7A is a plan view of the semiconductor device unit of the three-dimensional memory module according to the fifth embodiment of the present invention. FIG. 7B is a cross sectional view of the semiconductor device unit of the three-dimensional memory module in the fifth embodiment along the line C–C'.

As seen from FIG. 7B, a cavity 13 is provided for the carrier 1. The chip selector chip 3 is mounted in the cavity 13 and connected to the memory chip 4 via bumps, a circuit pattern, and bumps. Then, the chip selector chip 3 is sealed with a resin which has insulative property and anti-moisture property. At this time, the sealing resin 5 is filled in the cavity 13 such that the upper surface of the sealing resin 5 does not go out of the surface of the carrier 1.

Next, the memory chip 4 is mounted on the carrier 1 by use of the bumps in the same manner as in the first embodiment. After that, the bumps are sealed with the sealing resin 5.

According to this structure, a semiconductor device with small size, light weight, and high density can be realized. In case of this structure, the cavity 13 is not limited to one. More quantity of cavities 13 may be provided, if necessary.

Figure 8A:
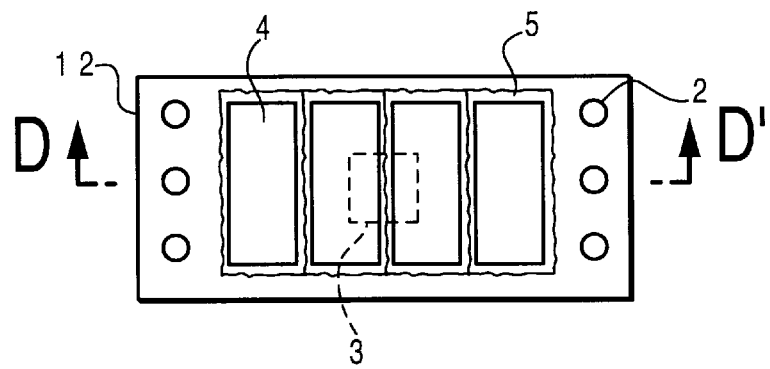
FIGS. 8A and 8B are a plan view and cross sectional view of the structure of a three-dimensional memory unit with a chip selector chip incorporated according to a sixth embodiment of the present invention.
Figure 8B:
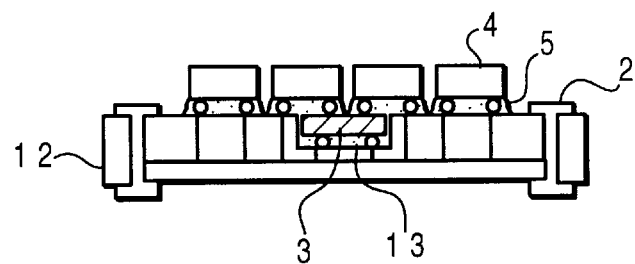

FIG. 8A is a plan view of the semiconductor device unit of the three-dimensional memory module according to the fifth embodiment of the present invention. FIG. 8B is a cross sectional view of the semiconductor device unit of the three-dimensional memory module in the fifth embodiment along the line D–D'.

As seen from FIG. 8B, the cavity 13 is provided for the carrier 12. The chip selector chip 3 is mounted in the cavity 13 and connected to the memory chip 4 via bumps, a circuit pattern, and bumps. Then, the chip selector chip 3 is sealed with a resin which has insulative property and ant-moisture property. At this time, the sealing resin 5 is filled in the cavity 13 such that the upper surface of the sealing resin 5 does not go out of the surface of the carrier 12.

Next, 4 memory chips 4 are mounted on the carrier 1 by use of the bumps in the same manner as in the fourth embodiment. After that, the bumps are sealed with the sealing resin 5.

By taking this structure, a semiconductor device with small size, light weight and high density can be realized. In case of this structure, according to the necessity, more cavities, more chip selector chips and more memory chips may be provided, if necessary.

Figure 9:
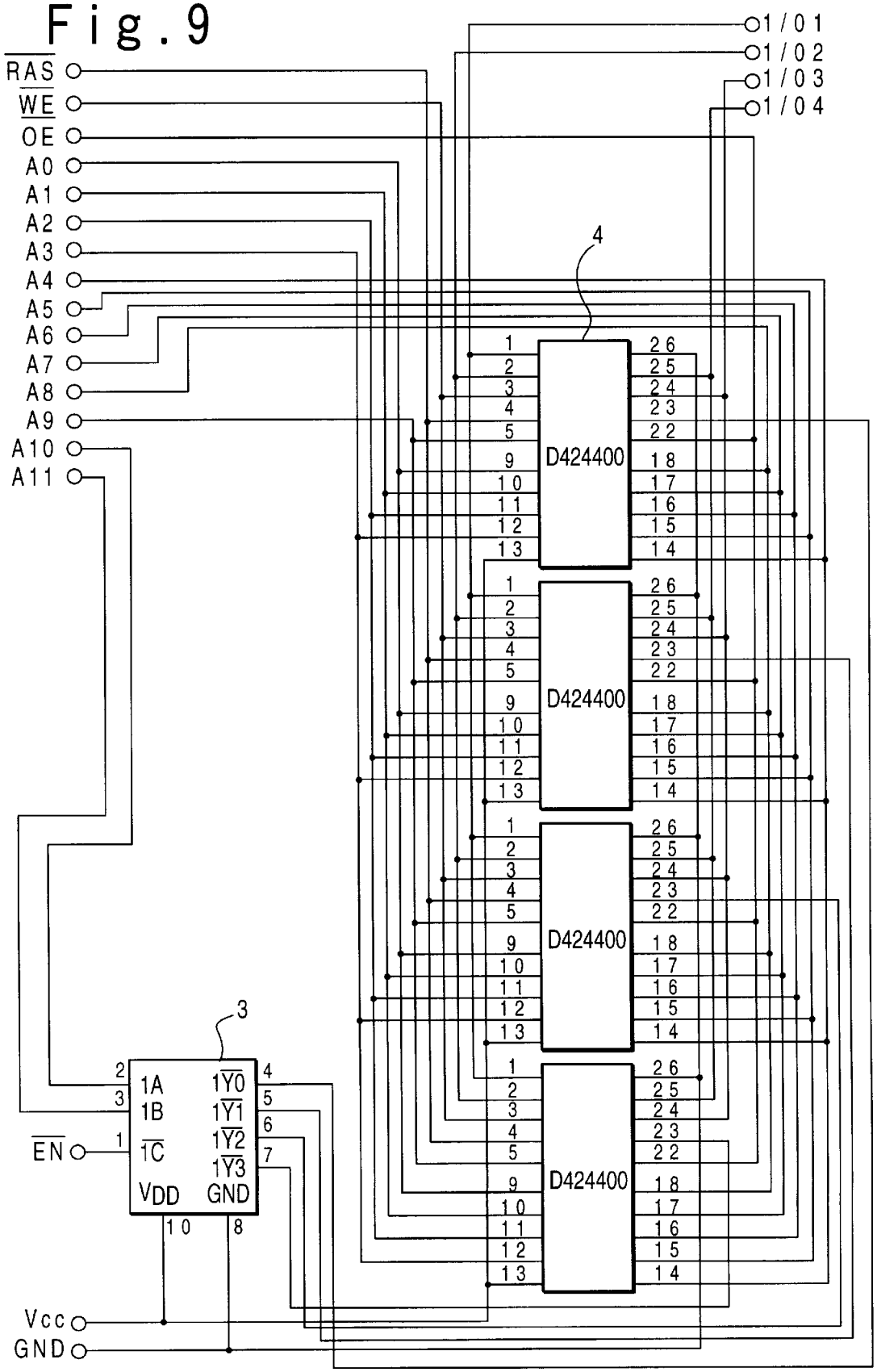
FIG. 9 is a circuit diagram illustrating of an example of the three-dimensional memory module of the present invention.
Figure 10:
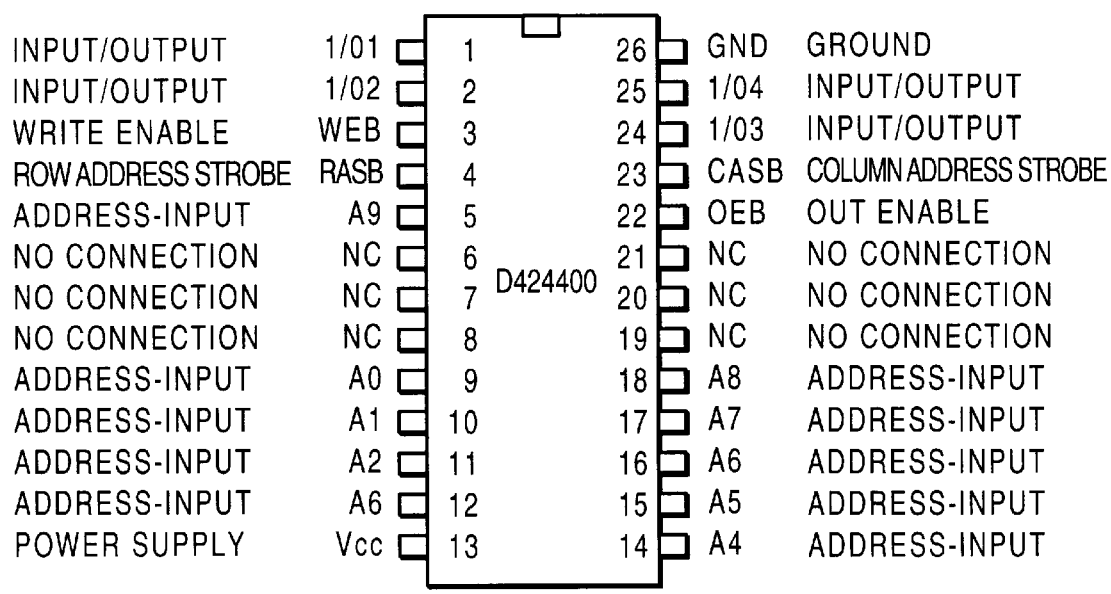
FIG. 10 is a diagram illustrating a memory device used in the three-dimensional memory module of the present invention.

Next, FIG. 9 shows the equivalent circuit example of a three-dimensional memory module with a chip selector chip incorporated, according to an embodiment of the present invention. Referring to FIG. 9, a RAM module, D424400, commercially available from NEC Corporation is used as the memory chip 4 and a chip selector chip commercially available from NEC Corporation is used as the chip selector chip 3. FIG. 10 shows the details of pin connection of the RAM module 4.

As described above, according to the present invention, memory chips and chip selector chips which are under mass production are connected to a carrier by use of the flip chip connection method to form a single semiconductor device unit. A plurality of semiconductor device units are stacked and connected by use of bumps. Thus, a three-dimensional memory module with the chip selector chip incorporated for the following generation can be realized with a short time and low cost to have a desired memory capacity.

Also, various methods of mounting a chip selector chip on a carrier may be employed such that a single chip selector chip is mounted on a single carrier, such that a single chip selector chip is provided for a plurality of stacked semiconductor device units, or such that a single chip selector chip is provided for a plurality of memory chips on a multi-chip type carrier. Therefore, one of the various methods of mounting the chip selector chip can be selected based on a desired memory capacity, a package density, a size, a weight and so on.

Further, the three-dimensional memory module with the chip selector chip incorporated of the present invention does not need the advanced technology, a long-term development and a huge resource and so on, which are needed in the conventional technique. As a result, a monolithic IC with a large memory capacity for the next generation can be realized for a short period with low cost in the form of a three-dimensional memory module with a chip selector chip incorporated.

What is claimed is:

1. A three-dimensional memory module comprising:
a plurality of stacked semiconductor device units, an adjacent two of which are stack-connected via through-holes and connecting bumps,
wherein each of said adjacent two semiconductor device units comprises:
a carrier having a circuit pattern and said through-holes connected to said circuit pattern;
at least one semiconductor memory chip mounted on said carrier such that said semiconductor memory chip is connected to said circuit pattern; and
at least one chip select semiconductor chip mounted on said carrier to be connected to said circuit pattern such that said chip select semiconductor chip can select said semiconductor memory chip.

2. A three-dimensional memory module according to claim 1, wherein said carrier further comprises a cavity, and said chip select semiconductor chip is mounted on a surface of said cavity of said carrier.

3. A three-dimensional memory module according to claim 2, wherein said at least one semiconductor memory chip is arranged to cover said chip select semiconductor chip via an insulative resin.

4. A three-dimensional memory module according to claim 1, wherein each of said semiconductor device units includes a plurality of semiconductor memory chips, and said plurality of semiconductor memory chips are arranged such that wiring lengths from said chip select semiconductor chip to said plurality of semiconductor memory chips are minimized.

5. A three-dimensional memory module comprising:
a plurality of semiconductor device units, every adjacent two of which are stack-connected via through-holes by bumps, and
wherein each of said plurality of semiconductor device units other than a specific one comprises:
a carrier having a first circuit pattern and said through-holes of said each semiconductor device unit connected to said first circuit pattern; and
at least one semiconductor memory chip mounted on said carrier such that said semiconductor memory chip is connected to said first circuit pattern, and
wherein said specific semiconductor device unit comprises:
a carrier having a second circuit pattern and said through-holes of said specific semiconductor device unit connected to said second circuit pattern; and
at least one chip select semiconductor chip mounted on said carrier to be connected to said second circuit pattern such that said chip select semiconductor chip can select said semiconductor memory chip of one of said plurality of semiconductor device units other than said specific semiconductor device unit.

6. A three-dimensional memory module according to claim 5, wherein said carrier of said specific semiconductor device unit further comprises a cavity, and said chip select semiconductor chip of said specific semiconductor device unit is mounted on a surface of said cavity of said carrier.

7. A three-dimensional memory module according to claim 6, wherein said at least one semiconductor memory chip is arranged to cover said chip select semiconductor chip via an insulative resin.

8. A three-dimensional memory modules according to claim 5, wherein each of said semiconductor device units includes a plurality of semiconductor memory chips, and said plurality of semiconductor memory chips are arranged such that distances from said chip select semiconductor chip to said plurality of semiconductor memory chips are minimized.

9. A semiconductor device, comprising:
a circuit board having a first circuit pattern; and
a plurality of three-dimensional memory modules mounted on said circuit board and connected to said first circuit pattern, and
wherein each of said plurality of three-dimensional memory module comprises:
a plurality of semiconductor device units, every adjacent two of which are stack-connected via through-holes by a bumps, and
wherein each of said plurality of semiconductor device units comprises:
a carrier having a second circuit pattern and said through-holes connected to said second circuit pattern;
at least one semiconductor memory chip mounted on said carrier such that said semiconductor memory chip is connected to said second circuit pattern; and
at least one chip select semiconductor chip mounted on said carrier to be connected to said second circuit pattern such that said chip select semiconductor chip can select said semiconductor memory chip.

10. A semiconductor device according to claim 9, wherein said carrier further comprises a cavity, and said chip select semiconductor chip is mounted on a surface of said cavity of said carrier.

11. A semiconductor device according to claim 10, wherein said at least one semiconductor memory chip is arranged to cover said chip select semiconductor chip via an insulative resin.

12. A semiconductor device according to claim 9, wherein each of said semiconductor device units includes a plurality of semiconductor memory chips, and said plurality of semiconductor memory chips are arranged such that distances from said chip select semiconductor chip to said plurality of semiconductor memory chips are minimized.

13. A semiconductor device comprising:
a circuit board having a first circuit pattern; and
a plurality of three-dimensional memory modules mounted on said circuit board and connected to said first circuit pattern,
wherein each of said plurality of three-dimensional memory module comprises:
a plurality of semiconductor device units, every adjacent two of which are stack-connected via through-holes by bumps, and
wherein each of said plurality of semiconductor device units other than a specific one comprises:
a carrier having a second circuit pattern and associated through-holes connected to said second circuit pattern; and
at least one semiconductor memory chip being mounted on said carrier such that said one semiconductor memory chip is connected to said second circuit pattern, and
wherein said specific semiconductor device unit comprises:
a carrier having a third circuit pattern and associated through-holes connected to said third circuit pattern; and
a chip select semiconductor chip mounted on said carrier connected to said third circuit pattern such that said chip select semiconductor chip can select said semiconductor memory chip of one of said plurality of semiconductor device units other than said specific semiconductor device unit.

14. A semiconductor device according to claim 13, wherein said carrier of said specific semiconductor device unit further comprises a cavity, and said chip select semiconductor chip of said specific semiconductor device unit is mounted on a surface of said cavity of said carrier.

15. A semiconductor device according to claim 14, wherein said at least one semiconductor memory chip is arranged to cover said chip select semiconductor chip via an insulative resin.

16. A semiconductor device according to claim 13, wherein each of said semiconductor device units includes a plurality of semiconductor memory chips, and said plurality of semiconductor memory chips are arranged such that wiring length from said chip select semiconductor chip to said plurality of semiconductor memory chips are minimized.

* * * * *